United States Patent [19]

Khajezadeh

[11] 4,001,872
[45] Jan. 4, 1977

[54] HIGH-RELIABILITY PLASTIC-PACKAGED SEMICONDUCTOR DEVICE

[75] Inventor: Heshmat Khajezadeh, Somerville, N.J.

[73] Assignee: RCA Corporation, New York, N.Y.

[22] Filed: May 23, 1975

[21] Appl. No.: 580,286

Related U.S. Application Data

[63] Continuation of Ser. No. 401,879, Sept. 28, 1973, abandoned.

[52] U.S. Cl. .................................. 357/54; 357/71; 357/72; 357/73
[51] Int. Cl.[2] ................. H01L 29/34; H01L 23/48; H01L 23/28; H01L 23/30
[58] Field of Search ................... 357/54, 71, 72, 73

[56] References Cited

UNITED STATES PATENTS

| | | | |
|---|---|---|---|
| 3,465,209 | 9/1969 | Denning et al. | 357/54 |
| 3,729,406 | 4/1973 | Osborne et al. | 357/73 |
| 3,751,292 | 8/1973 | Kongable | 357/71 |
| 3,760,242 | 9/1973 | Duffy et al. | 357/73 |
| 3,833,919 | 9/1974 | Naber | 357/73 |
| 3,871,018 | 3/1975 | Jackson et al. | 357/70 |
| 3,913,127 | 10/1975 | Suzuki et al. | 357/76 |

*Primary Examiner*—Andrew J. James
*Attorney, Agent, or Firm*—H. Christoffersen; R. P. Williams

[57] ABSTRACT

A plastic-packaged semiconductor device includes a semiconductor chip with a hermetic passivation and metallization system, including silicon nitride passivation and noble metal interconnection conductors. The device is highly resistant to degradation in the presence of water vapor and corrosive atmospheres.

2 Claims, 4 Drawing Figures

HIGH-RELIABILITY PLASTIC-PACKAGED SEMICONDUCTOR DEVICE

This is a continuation of application Ser. No. 401,879 filed Sept. 28, 1973, now abandoned.

This invention relates to semiconductor devices of the type having a molded plastic encapsulation.

Plastic packaging for semiconductor devices is favored as a low cost, convenient, and practical technique. The so-called dual in-line plastic package is commonly used for integrated circuit devices. This package has a prismatic plastic body with leads emerging from two of the long sides of the body and bent to lie in two or more parallel rows. Inside the plastic body, a semiconductor chip is connected to the leads, usually by means of wires although other interconnection conductors may be employed. This type of package has found wide acceptance, particularly because of its low cost and its adaptability to automated manufacturing systems.

Plastic-packaged devices have not heretofore been accepted for use in adverse environments such as those which involve high humidity, high temperature, corrosive acid vapors, or the like. The encapsulating plastic material does not shield the semiconductor chip against the action of adverse materials, so that the adverse materials can enter the package and react chemically with the semiconductor chip itself, thus leading to its degradation.

Many techniques have been proposed for protecting semiconductor chips against adverse ambient conditions. For example, interconnection metallization systems made of the noble metals have been employed, for their resistance to oxidation and corrosion. Usually the noble metal metallization systems are multilayer systems, inasmuch as no one of the noble metals has all of the characteristics needed for good semiconductor metallization, such as ease of ohmic contact to silicon, adherence to silicon dioxide, etc. It is known also to cover noble metal interconnections with protective coatings. Note Clarke et al., U.S. Pat. No. 3,419,765, for example, and Denning et al., U.S. Pat. No. 3,465,209. While the structures and processes disclosed in these patents are quite satisfactory, adequate protection of the chip is still not realized.

One of the problems associated with the use of gold in an interconnection system is that gold atoms migrate (in the presence of water vapor, heat, and operating voltages) away from a conductor and bridge the gaps between conductors, producing inoperable circuit conditions. The prior art does not appear to recognize this problem and does not suggest how it may be solved.

Figure 1:
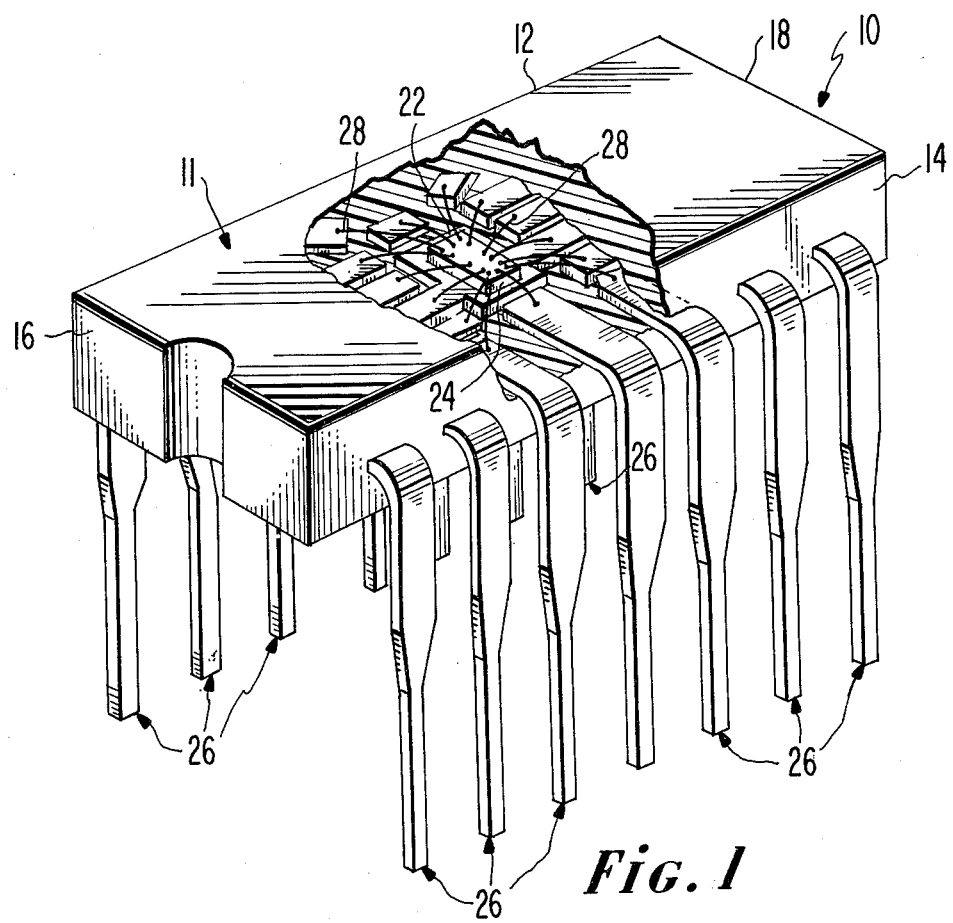
FIG. 1 is a perspective view, with parts broken away, of a dual in-line plastic-packaged semiconductor device.

In its preferred form, the present device, indicated generally at 10 in FIG. 1, is illustrated as an integrated circuit device and includes a body 11 of polymeric material which has the form of an enlongated rectangular prism. The body 11 has a pair of relatively long sides 12 and 14 and a pair of relatively short ends 16 and 18. Disposed centrally within the body 11 is a metallic support pad 22 on which an integrated circuit chip 24 is centrally mounted. The details of construction of the chip 24 will be explained below.

A plurality of electrical leads 26 are embedded within the plastic material of the body 11 and extend from the interior of the body 11, each from a position close to the pad 22, to the exterior of the body 11 through the relatively long sides 12 and 14 thereof. The leads 26 are bent into the well-known dual in-line configuration. Electrical connection is made between the leads 26 and the active elements on the chip 24 by means of, for example, fine wires 28, which are connected, as by ultrasonic bonding, to the leads 26 and to the chip 24.

Figure 2:
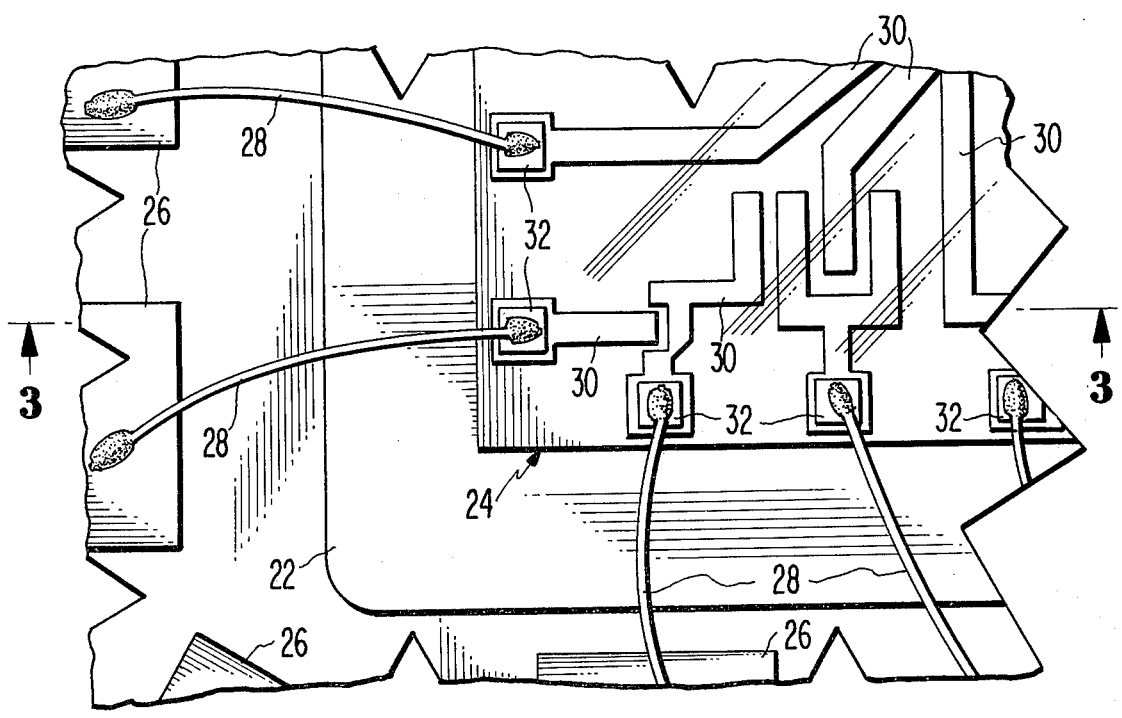
FIG. 2 is a partial plan view of a semiconductor chip adapted to be used in the package of FIG. 1, together with interconnection and lead elements associated therewith.
Figure 3:
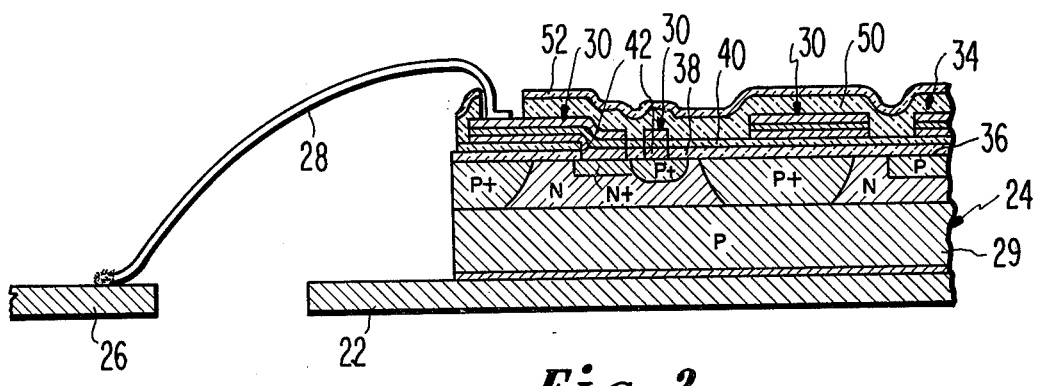
FIG. 3 is a cross section taken on the line 3—3 of FIG. 2.

One corner of the support pad 22 and of the chip 24 is shown in FIG. 2 in enlarged form and in cross section in FIG. 3. As shown, the chip 24 includes a body 29 of silicon (FIG. 3) which has a plurality of interconnection conductors 30 thereon, some of which terminate in bonding pads 32, located adjacent to the periphery of the body 29. The pattern of the interconnection conductors 30 is dependent on the circuit used on the chip 24 and is not critical to the present invention. The interconnection wires 28 are shown as connected between the bonding pads 32 and the leads 26. This arrangement is generally conventional.

Figure 4:
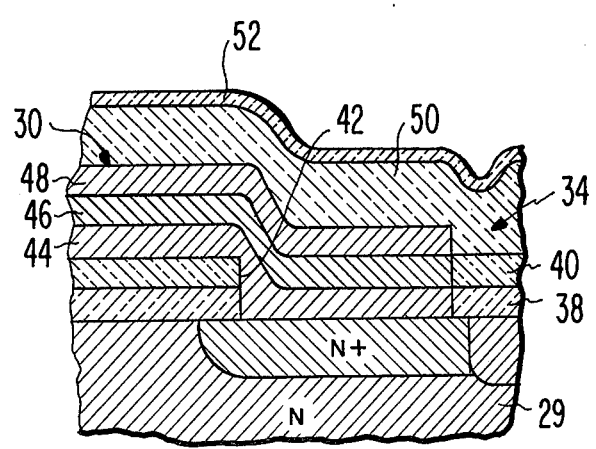
FIG. 4 is an enlarged view of a portion of the cross section of FIG. 3.

The conductors 30 are illustrated in FIG. 2 as visible through a passivating coating 34 (FIGS. 3 and 4). As best seen in FIG. 3, the body 29 includes various regions of N and P type conductivity which define PN junctions terminating in a surface 36 of the body 29. On the surface 36 of the body 29 is the passivation and interconnection metallization system which protects the chip and interconnects the various regions into a desired circuit configuration. First, there is a layer 38, preferably of silicon dioxide, which may be thermally grown by heating the body 29 in an oxidizing atmosphere in known manner. On the silicon dioxide layer 38 is a second layer 40, of silicon nitride. The layer 40 may be deposited by the pyrolytic decomposition of silane ($SiH_4$) and ammonia, also in known manner. The layers 38 and 40 are provided with openings 42 to expose portions of the surface of the body 29 wherever contact is desired to the semiconductive material.

The metallization conductors 30 are made in the manner known for "beam lead" conductors, as described, for example, in Lepselter, U.S. Pat. No. 3,287,612. The conductors 30 each include a first layer 44 of deposited titanium, a second layer 46 of deposited platinum or palladium, and a third layer 48 of deposited gold, all of these layers functioning as they do in a conventional beam lead system. Note, however, that they are not used in the cantilevered beam lead configuration but instead terminate near the periphery of the chip in the bonding pads 32. This allows the present structure to be readily made in an otherwise conventional manufacturing operation without modification of any of the photomasks used in the processing; that is, the same photomasks can be used for both conventional aluminum-metallized products and for the high-reliability products of this invention.

The protective coating 34 over the conductors 30 (and the upper surface of the chip 24) has the following characteristics. It includes a first layer 50, preferably of silicon dioxide, which may be formed by the pyrolytic decomposition of silane (SiH$_4$) in the presence of oxygen, in a manner generally known to those of ordinary skill. The layer 50 is doped with phosphorus, preferably by including phosphine (PH$_3$) in the decomposing ambient, which, as in the Denning et al. patent mentioned above, appears to act to remove certain impurities from the underlying surface of the body 29. Finally, the coating 34 includes a top layer 52 which is of undoped silicon dioxide, preferably derived from silane (alone) with oxygen, which aids in preventing the entry of water vapor, again, as in the manner described in the Denning et al. patent.

As mentioned above, one of the problems associated with the use of gold interconnections in semiconductor devices has been the migration of gold across the spaces between conductors, with the result that short circuits occur. It has been found that a relatively thick protective coating will eliminate the problems associated with gold migration; that is, with a relatively thick coating, devices remain operative for long periods of time. In particular, the combined thicknesses of the layers 50 and 52 should be at least 10,000 A. In one preferred embodiment of the present device, the coating 34 is 15,000 A thick, made up of the phosphorus-doped layer 50 of 14,000 A and the undoped layer 52 of 1000 A in thickness.

The layers 50 and 52 are preferably formed in the following manner. A silicon wafer containing a plurality of chips 24 is heated in a conventional reactor to a temperature of approximatly 430° C (+5° C). To form the phosphorus-doped layer 50, the following gases are introduced into the reactor. The flow rates are controlled in known manner to provide the following proportions of the gases, relative to the one percent phosphine-nitrogen component:

| | |
|---|---|
| Nitrogen | 500 parts |
| Oxygen | 120 parts |
| 3% Silane (balance nitrogen) | 14.1 parts |
| 1% Phosphine (balance nitrogen) | 1 part |

The proportions of the gases are given in this manner because the actual flow rates are dependent on the particular apparatus used. In general terms, there should be about 14 times as much 3% silane as there is 1% phosphine, enough oxygen to carry the reaction to completion, and whatever amount of nitrogen (or other inert gas) as is necessary to create turbulence in the reactor, if such turbulence is required. Under these conditions, the phosphorus-doped layer 50 grows at a rate of approximatley 700 A per minute. Consequently, when the deposition is carried out for approximately twenty minutes, the phosphorus-doped layer 50 grows to a thickness of 14,000 A.

After 20 minutes of deposition, the flow of phosphine is stopped, so that only the silane, oxygen, and nitrogen flows continue. This produces the undoped layer 52. About 1000 A of this layer are deposited when the procedure is carried out for about 1.5 minutes.

After the formation of the protective coating 34, openings are formed, by conventional photolithographic processes, in the coating 34 over the bonding pads 32. The device 10 is then completed by separating the wafer to form the chip 24, mounting the chip 24 on a lead frame, bonding the wires 28 between the bonding pads 32 and the leads 26 of the lead frame, transfer-molding the body 11, and thereafter sheering and forming the lead frame.

When the chip 24 is constructed with the present new combination of the silicon nitride coating 40, the noble metal-containing conductors 30, and the thick protective coating 34, as described here, and incorporated in an otherwise conventional molded plastic package, it has been found that the device is highly resistant to degradation in the presence of water vapor and corrosive atmospheres. So-called "pressure-cooker" tests have been carried out in which devices have been subjected to relative humidities of 85 percent at 85° C and with operating voltages applied to the device. Under these conditions, samples of the present novel device have survived for as long as 5000 hours, whereas conventional aluminum-metallized products have failed in approximately 500 to 1000 hours. Comparative data are not available for a structure such as that described by Clark et al., identified above.

What is claimed is:

1. A plastic-packaged semiconductor device having improved resistance to degradation in the presence of water vapor and corrosive atmospheres comprising
    a body of silicon having a surface, PN junction-defining regions in said body adjacent to said surface, passivating means comprising a layer of silicon dioxide on said surfce and a silicon nitride layer on said layer of silicon dioxide, a metallization system comprising a plurality of conductors, each conductor comprising a first layer of titanium, a second layer, of platinum or palladium, and a third layer of gold, and a pyrolytically-deposited silicon dioxide protective coating having a thickness of at least 10,000 A over said metallization system,
    a plurality of leads, each having a portion adjacent to said silicon body,
    means for interconnecting said metallization system with said plurality of leads, and
    a transfer molded body of polymeric material surrounding said silicon body, said interconnecting means, and parts of said leads, whereby the combination of the silicon dioxide protective coating and the surrounding transfer molded body of polymeric material protects the metallization system to prevent degradation thereof.

2. A plastic-packaged semiconductor device as defined in claim 1 wherein said silicon dioxide protective coating is approximately 15,000 A thick, said coating having two layers therein, one layer having a thickness of about 14,000 A and comprising phosphorus-doped silicon dioxide, the other layer being about 1000 A thick and comprising undoped silicon dioxide.

* * * * *